(12) United States Patent  (10) Patent No.: US 7,514,286 B2
Ozawa  (45) Date of Patent: Apr. 7, 2009

(54) METHOD FOR FORMING INDIVIDUAL SEMI-CONDUCTOR DEVICES

(75) Inventor: Nobuo Ozawa, Minato-ku (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 95 days.

(21) Appl. No.: 11/066,313

(22) Filed: Feb. 28, 2005

(65) Prior Publication Data

US 2006/0046437 A1    Mar. 2, 2006

(30) Foreign Application Priority Data

Aug. 25, 2004    (JP) ............................. 2004-244609

(51) Int. Cl.
*H01L 21/00*    (2006.01)
(52) U.S. Cl. ........................... 438/51; 438/52; 438/113; 438/464; 73/504.12
(58) Field of Classification Search ................ 438/106, 438/49, 48, 50, 52, 51, 109–110, 107, 108, 438/455, 379, 465; 72/504.12
See application file for complete search history.

(56) References Cited

U.S. PATENT DOCUMENTS 6,444,499 B1 * 9/2002 Swiss et al. ................. 438/127

6,772,632 B2 * 8/2004 Okada ...................... 73/514.38
7,129,114 B2 * 10/2006 Akram ........................ 438/110
2005/0184351 A1 * 8/2005 Fu .............................. 257/415

FOREIGN PATENT DOCUMENTS

JP    2001-144035    5/2001

* cited by examiner

*Primary Examiner*—W. David Coleman
*Assistant Examiner*—Su C Kim
(74) *Attorney, Agent, or Firm*—Volentine & Whitt, P.L.L.C.

(57) ABSTRACT

A method that forms individual semiconductor devices from a semiconductor substrate including a first face having a first region in which micro-mechanical elements are formed and a second region which surrounds the first region and in which a scribe line is formed, and a second face having a third region which is opposed to the first face and corresponds to the first region in which the micro-mechanical elements are formed and a fourth region which surrounds the third region and corresponds to the second region. The method includes thinning the fourth region of the second face which corresponds to the scribe line formed in the second region of the first face, and cutting the semiconductor substrate along the scribe line formed in the second region of the first face.

17 Claims, 5 Drawing Sheets

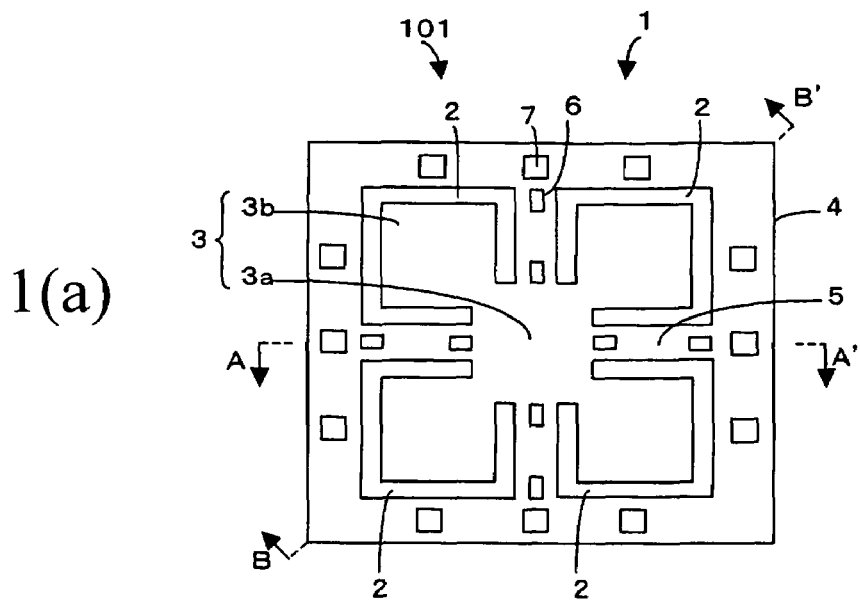
1(a)
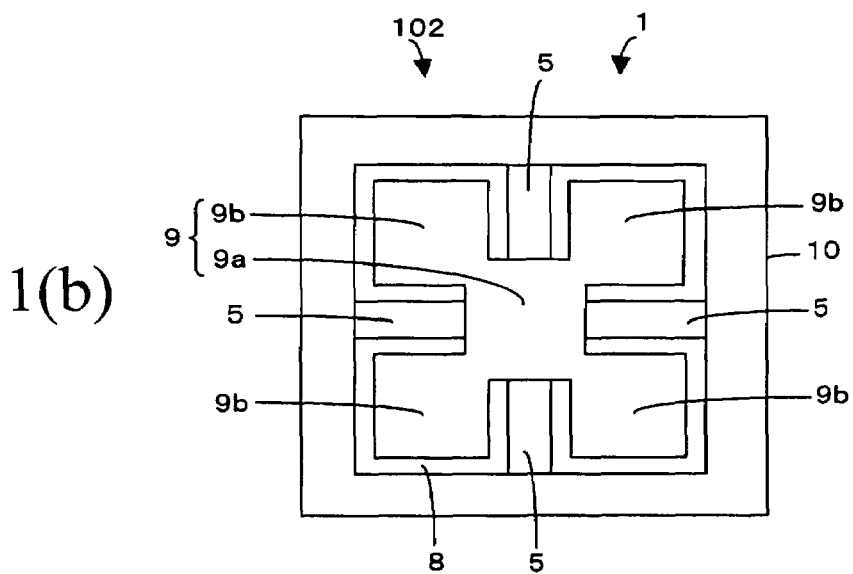
1(b)
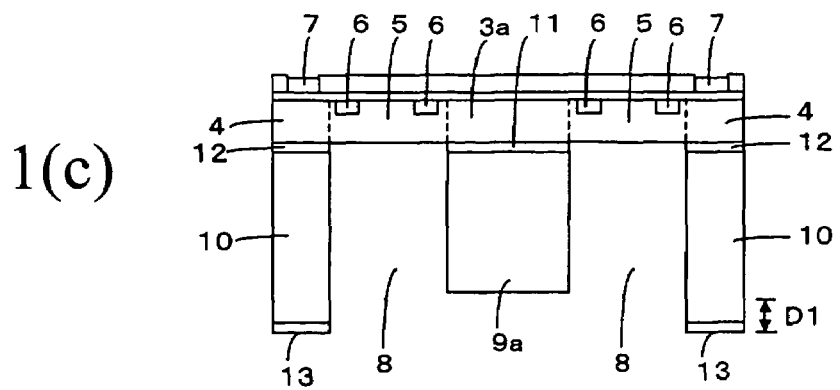
1(c)

METHOD FOR FORMING INDIVIDUAL SEMI-CONDUCTOR DEVICES

BACKGROUND OF THE INVENTION

1. Field of the Invention

The present invention generally relates to a method for forming semiconductor devices. More specifically, the present invention relates to a method for forming individual semiconductor devices including micro-mechanical elements formed on a semiconductor substrate, also known as MEMS (Micro Electro Mechanical System) chips.

2. Background Information

MEMS is a system by which very small micro-mechanical elements and electronic circuits are integrated on a semiconductor substrate by using ultra-fine processing technology for the semiconductor. MEMS chips are mechanically cut by a diamond cutter when they are separated into individual chips, in a process that is generally similar to those of typical semiconductor devices.

A method for forming individual semiconductor devices is disclosed in Japanese Laid-Open Patent Publication TOKU-KAI No. JP2001-144035 (especially page 3-4, FIGS. 1 and 2), for example, the entire disclosure of which is hereby incorporated by reference. The method for forming individual semiconductor devices disclosed in JP2001-144035 in the WCSP (WaferLevel Chip Size Package) semiconductor device in which package molding is performed while in a wafer state includes two steps; a first step of cutting only molding resin, and a second step of cutting a semiconductor substrate. The first step of cutting the molding resin is performed in a non-contact processing manner by using a laser, for example. The second step of cutting the semiconductor substrate is performed in a contact processing manner by using a mechanical cutting tool such as a diamond cutter. Cutting the molding resin in a non-contact processing manner can suppress the peeling-off of molding resin due to external forces in the cutting, and it is possible to form individual semiconductor devices with high quality.

Since a mechanical element included in an MEMS chip is very fragile with regards to external vibration and impact, in a dicing process where individual MEMSs are formed, the mechanical elements are easily damaged due to the mechanical vibration or impact from cleaning water spray.

In the method for forming individual semiconductor devices disclosed in JP2001-144035, a contact processing using a mechanical cutting tool is performed on the semiconductor substrate in the second step. Accordingly, it is inevitable that vibrations or an impact occurs when cutting. For this reason, it is not preferable that this method for manufacturing be applied to a dicing process for MEMS.

In view of the above, it will be apparent to those skilled in the art from this disclosure that there exists a need for an improved a method for forming individual semiconductor devices. This invention addresses this need in the art as well as other needs, which will become apparent to those skilled in the art from this disclosure.

SUMMARY OF THE INVENTION

A method for forming individual semiconductor devices according to a first aspect of the present invention from a semiconductor substrate includes a first face and a second face. The first face has a first region in which micro-mechanical elements are formed, and a second region which surrounds the first region and in which a scribe line is formed. The second face has a third region which is opposed to the first face and corresponds to the first region in which the micro-mechanical elements are formed, and a fourth region which surrounds the third region and corresponds to the second region. The method includes steps of thinning the fourth region of the second face which corresponds to the scribe line formed in the second region of the first face, and cutting the semiconductor substrate along the scribe line formed in the second region of the first face.

In the method for forming individual semiconductor devices according to the present invention, the step of cutting the semiconductor substrate is performed in a manner that does not utilize cutting.

According to the present invention, a semiconductor substrate located in the position in forming individual semiconductor devices, which corresponds to a scribe line as a cutting region, is thinned from the face (first face) where the scribe line is formed. Accordingly, it is possible to cut the semiconductor substrate in a non-contact cutting manner by using an instrument such as a laser. Therefore, it is possible to suppress damage to the mechanical element of MEMS chips due to an external force applied while cutting.

These and other objects, features, aspects, and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure:

FIGS. 1(a) to 1(c) are structural views of an acceleration sensing device in accordance with a first embodiment of the present invention;

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

First Embodiment

Referring to a method for forming individual semiconductor devices (MEMSs) according to a first embodiment of the present invention, an exemplary piezoresistance type acceleration sensing device 1 produced by using an SOI substrate is described.

Structure

FIGS. 1(a) to 1(c) show structural views of the piezoresistance type acceleration sensing device 1 produced by using the SOI substrate. FIG. 1(a) shows a plan view of the acceleration sensing device 1. FIG. 1(b) shows a bottom view thereof. FIG. 1(c) shows a cross-sectional view taken along a line A-A' of FIG. 1(a).

Figure 2:
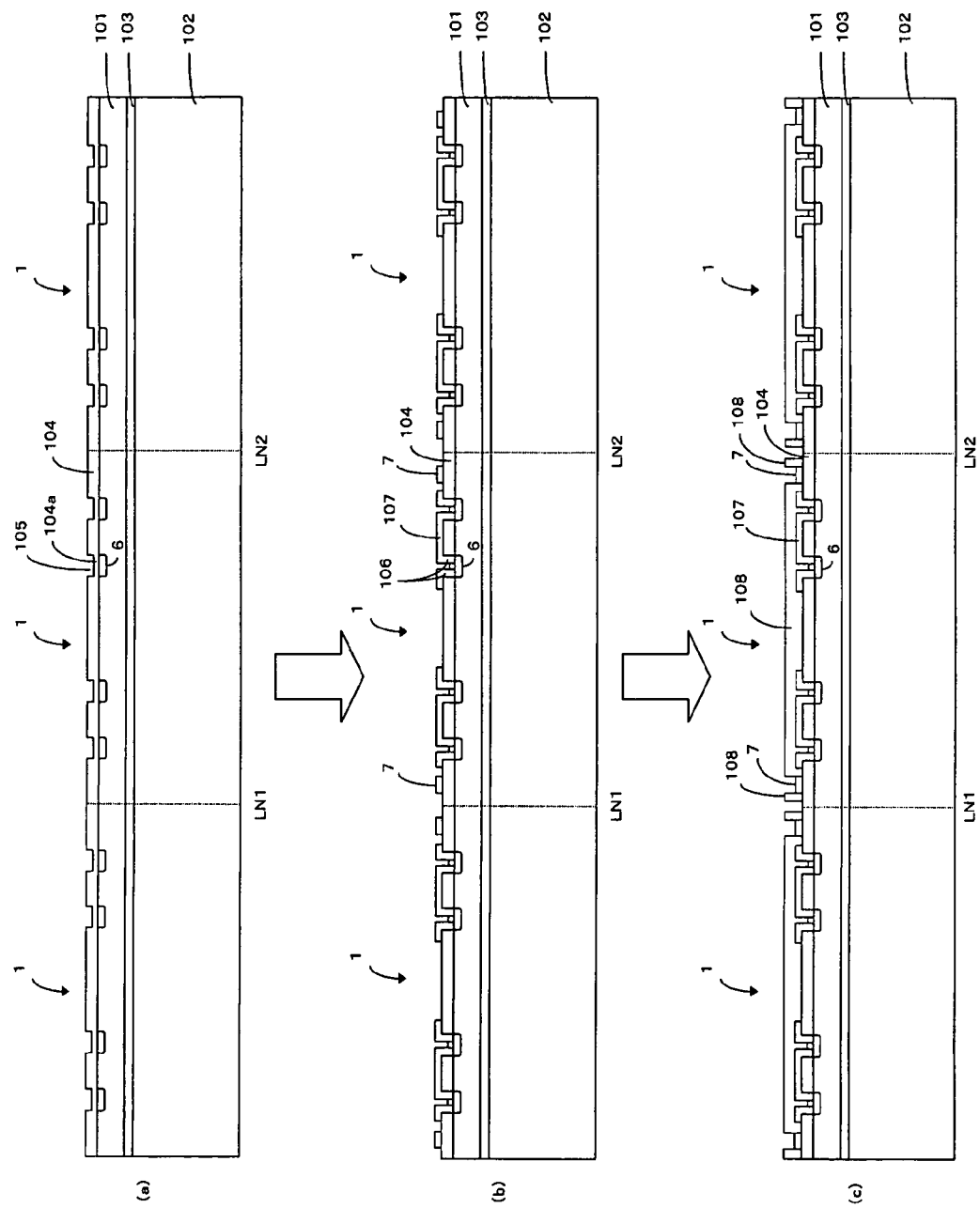
FIG. 2 is a view of diagrams illustrating processes in a method for manufacturing an acceleration sensing device according to the first or second embodiment.

As shown in line (a) of FIG. 2, the SOI substrate is a semiconductor substrate that includes a buried oxide film 103 provided with a first Si film 101 and a second Si film 102 formed on opposing sides of the buried oxide film 103. As shown in FIG. 1(a), the first Si film 101 is divided by dividing grooves 2 on a first face, thus, a mass portion 3, a support portion 4, and beam portions 5 are formed therein. The mass portion 3 includes a substantially rectangular-shaped central mass portion 3a, and four substantially rectangular-shaped peripheral mass portions 3b, which are formed integrally with the central mass portion 3a in the respective four corners to extend therefrom.

The support portion 4 is a substantially rectangular-frame-shaped part, which is formed to surround the mass portion 3, that is, the central mass portion 3a and the four peripheral mass portions 3b. Electrode pads 7 that externally provide signals from piezoresistance elements 6 are provided on the upper surface of the support portion 4 at a prescribed interval.

The beam portions 5 are plate-shaped parts, which connect the central mass portion 3a of the mass portion 3 to the support portion 4 so that the substantially center of the central mass portion 3a is connected to the substantially center of each side of the support portion 4. The beam portion 5 is flexible to bend according to the movement of the mass portion 3 in the vertical and horizontal directions. The piezoresistance elements 6 are formed on the upper surface of the beam portions 5 at the prescribed interval, thus, the resistances of the piezoresistance elements 6 vary according to the bends in the vertical and horizontal directions of the beam portions 5. Although wires which connect the piezoresistance element 6 to the electrode pad 7 are omitted from the figures for ease of explanation, the signals based on the variations of the resistances of piezoresistance elements 6 are externally provided from the electrode pads 7 through wires (not shown).

As shown in FIG. 1(b), the second Si film 102 is divided by grooves 8, thus, a weight portion 9 and a mount portion 10 are formed therein. The weight portion 9 includes a substantially rectangular-shaped central weight portion 9a, and four substantially rectangular-shaped peripheral weight portions 9b which are formed integrally with the central weight portion 9a in the respective four corners to extend therefrom. The central weight portion 9a is fixed under the lower surface of the central mass portion 3a so that a weight intermediate film 11 made of the buried oxide film 103 is interposed between the central weight portion 9a and the central mass portion 3a, as shown in FIG. 1(c). The four peripheral weight portions 9b are similarly fixed under the lower surfaces of the peripheral mass portions 3b so that the weight intermediate film 11 is interposed between each peripheral weight portion 9b and each peripheral mass portion 3b.

The mount portion 10 is a substantially rectangular frame shaped part, which is formed to surround the weight portion 9, that is, the central weight portion 9a and the four peripheral weight portions 9b, as shown in FIG. 1(b). The mount portion 10 is fixed to the lower surface of the support portion 4 so that a peripheral intermediate film 12 made of the buried oxide film 103 is interposed between them. An oxide film 13 is formed on the bottom surface of the mount portion 10. There is a difference in a prescribed distance D1 between the bottom surface of the mount portion 10 and the bottom surface of the weight portion 9 (9a, 9b).

Method for Manufacturing Device and Forming Individual Devices

Forming Electric Element

FIG. 2 schematically shows cross-sectional views mainly corresponding to the location taken along the line A-A' of FIG. 1(a) of electric elements in the acceleration sensing device 1 being formed therein or thereon, such as piezoresistance elements, electrode pads, and wires, for example, in order of processes. These electric elements serve to convert mechanical strain of the acceleration sensing device 1 into electric signals. FIG. 2 shows three adjacent chips in a plurality of the acceleration sensing devices 1 formed on a wafer. Fictitious boundary lines LN1 and LN2 are drawn between the chips. The area inside the boundary lines LN1 and LN2 is a first region and the area surrounding the first region in which the scribe lines are formed is a second region. The area opposite the first face (top of the Figures) is a second face. The area corresponding to the first region on the second face is the third region, and the area corresponding to the second region is a fourth region. In a later process, cutting regions, so-called scribe lines, which are used as base lines to form individual devices, are formed on the positions of these fictitious boundary lines LN1 and LN2.

First, as shown in line (a) of FIG. 2, the SOI substrate of the buried oxide film 103 provided with the first Si film 101 and the second Si film 102 formed on both sides thereof is prepared. The SOI substrate is thermally oxidized in a humidified atmosphere at 1000° C. Thus, an oxide film 104 with 4000 Å is formed on the surface of the first Si film 101. Subsequently, openings 105 are formed in the oxide film 104 by photolithographic etching. Boron is thermally diffused through the openings 105. Thus, a P-type diffusion layer is formed. This P-type diffusion layer becomes the piezoresistance element 6. Generally, the thermal diffusion of boron is performed at high temperatures of 800 to 1200° C. At this time, an oxide film 104a with 2000 Å is formed on the surface of opening 105.

Subsequently, as shown in line (b) of FIG. 2, a contact hole 106 is formed in this oxide film 104a by photolithographic etching. After that, an aluminum film is deposited by sputtering, and wires 107 and the electrode pad 7 are formed by photolithographic etching.

Then, as shown in line (c) of FIG. 2, a silicon nitride layer 108, which becomes a protective film, is deposited by a PRD (Plasma Reactive Deposition) process, and the electrode pads 7 are exposed by photolithographic etching. At the same time, the silicon nitride layer 108 in the regions corresponding to the scribe lines LN1 and LN2 is also removed.

Forming Mechanical Element

Figure 3:
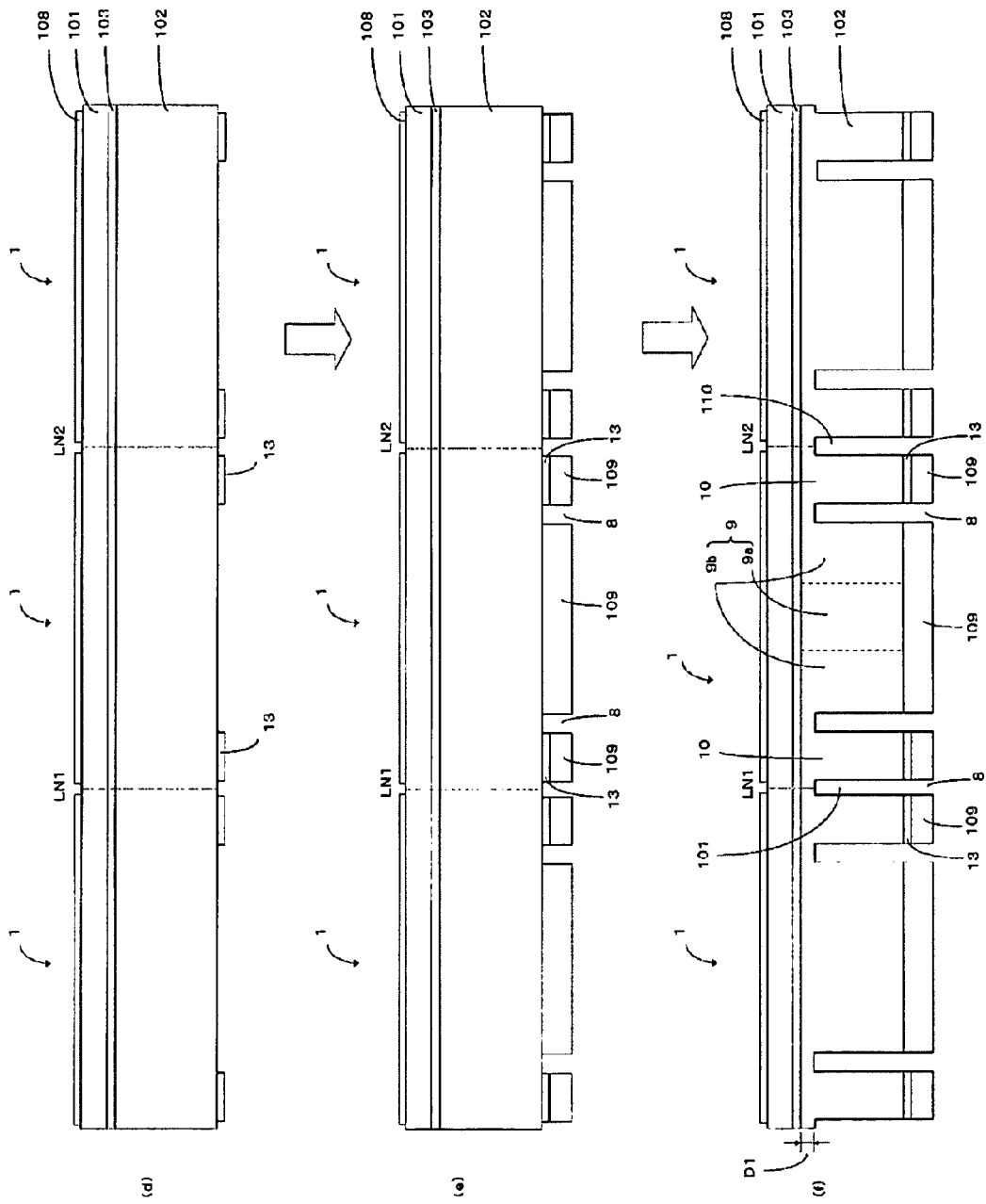
FIG. 3 is a view of diagrams further illustrating processes in the method for manufacturing the acceleration sensing device according to the first or second embodiment.
Figure 4:
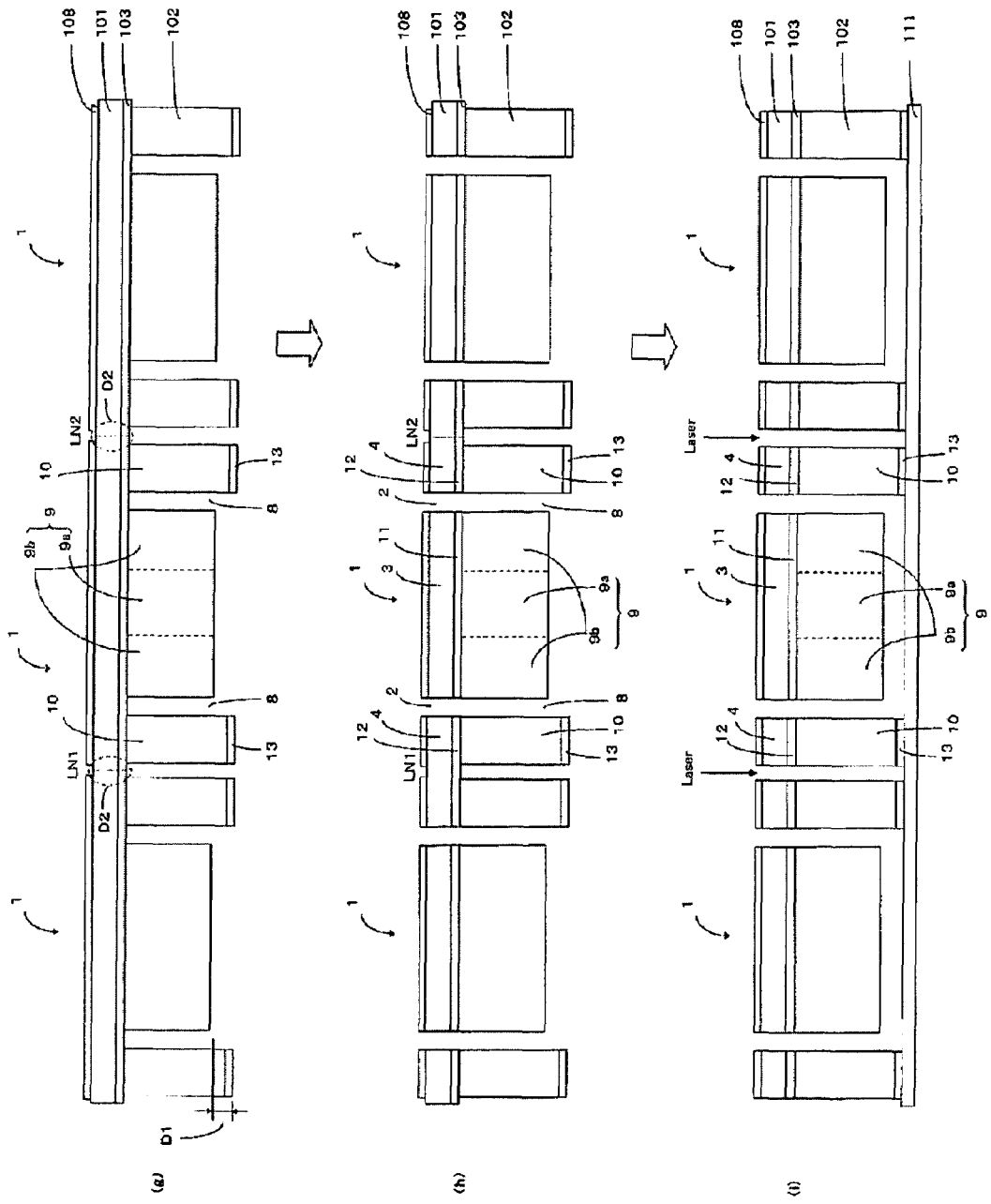
FIG. 4 is a view of diagrams even further illustrating processes in the method for manufacturing the acceleration sensing device according to the first or second embodiment.

FIGS. 3 and 4 schematically show cross-sectional views corresponding to the location taken along a line B-B' of FIG. 1(a), in order of manufacturing processes of mechanical elements. These figures show three adjacent acceleration sensing devices 1 on the wafer, and the fictitious boundary lines LN1 and LN2 are drawn on the locations between the chips corresponding to the scribe lines, similar to those of FIG. 2. Although the electric elements have been already formed on the first Si film 101 of the SOI substrate in the above procedure, only the silicon nitride layer 108, which is the protective film, is shown in FIGS. 3 and 4 for ease of explanation.

First, as shown in line (d) of FIG. 3, the oxide film 13 is deposited on the surface of the second Si film 102 of the SOI substrate by a CVD (Chemical Vapor Deposition) process. Then, photolithographic etching processing is performed so that the oxide film 13 remains in the region, which becomes the mount portion 10, and the resist is removed. Besides, in some cases, an SOI substrate has an oxide film, which is previously formed on the surface of the second Si film 102. In these cases, it is not necessary to deposit the oxide film 13 thereon. Starting processes from the photolithographic etching process are only required.

Subsequently, as shown in line (e) of FIG. 3, a resist pattern 109 is formed so that the regions corresponding to the grooves 8 and the regions corresponding to the scribe lines LN1 and LN2 are exposed.

Subsequently, as shown in line (f) of FIG. 3, the second Si film 102 is etched with the resist pattern 109 as a mask by Gas Chopping Etching Technology (GCET), and the grooves 8 are formed. Thus, the weight portion 9 and the mount portion 10 are divided. The regions corresponding to the scribe lines LN1 and LN2 are also etched at the same time, and grooves 110 are formed. Thus, the scribe line is thinned. In this case, the second Si film 102 has a prescribed thickness D1 remaining at the bottom surfaces of the groove 8 and the groove 110. In other words, the bottom of the grooves 8 and 110 are separated from the buried oxide film 103 by the prescribed thickness D1. For example, in the case where the initial thickness of second Si film 102 is 500 μm, the amount of etching is set to 480 μm. Thus, the second Si film 102 with a thickness D1 of about 20 μm remains between the bottom of the grooves 8 and 110 and buried oxide film 103.

Subsequently, the resist pattern 109 is removed. As shown in line (g) of FIG. 4, the second Si film 102 that remains at the bottom surfaces of the groove 8 and the groove 110 is removed with the oxide film 13 as a hard mask by Gas Chopping Etching. Thus, the buried oxide film 103 is exposed. In this process, the thickness D2 of scribe line LN1 and LN2 regions is reduced to about 5 to 10 μm. At the same time, the bottom surface of the weight portion 9 is also etched by the prescribed distance D1. The prescribed difference of the thickness D1 is provided between the bottom surface of the weight portion 9 and the bottom surface of the mount portion 10.

Subsequently, as shown in line (h) of FIG. 4, the silicon nitride layer 108 and the first Si film 101 of the regions corresponding to the grooves 2 are removed by photolithographic etching. The buried oxide film 103 exposed in the grooves 2 is removed by dry etching. While the weight intermediate film 11 is formed between the mass portion 3 and the weight portion 9, and the peripheral intermediate film 12 is formed between the support portion 4 and the mount portion 10.

According to the foregoing processes, the wafer which has a plurality of the acceleration sensing devices 1 and the thinned scribe lines LN1 and LN2 is completed.

Forming Individual Devices

The completed wafer is made to adhere to dicing tape 111 as shown in line (i) of FIG. 4. The thinned scribe lines LN1 and LN2 are cut in a non-contact cutting manner using a tool such as a laser, for example. Thus, individual acceleration sensing devices are formed. Generally, the allowable cutting thickness range of the laser is about 100 μm. In comparison with this range, the thickness D2 of the thinned scribe line region is 5 to 10 μm. Accordingly, the thinned scribe line region can be easily cut by a laser. The cutting manner is not limited to a laser, but any cutting processes can be applied as long as the mechanical element of the acceleration sensing device does not receive vibration and an impact.

Finally, the adhesive force of the dicing tape 111 is weakened by UV (Ultra Violet) irradiation, heat treatment, and so on. Thus, the individual acceleration sensing devices 1 are removed.

Operation/Working-Effect

In the method for forming individual semiconductor devices according to the first embodiment, the scribe lines LN1 and LN2, which are the cutting regions in forming of individual semiconductor devices, is thinned from the back surface, thus, the scribe lines can be cut in a non-contact cutting manner by using a tool such as a laser. Therefore, it is possible to suppress damage to the mechanical element of MEMS chips (acceleration sensing device) due to external forces from cutting. The scribe lines LN1 and LN2 can be thinned simultaneously with a part of manufacturing processes of MEMSs, in this embodiment, for example, the process in which the weight portion 9 and the mount portion 10 are divided by forming the grooves 8 (see line (f) of FIG. 3). Accordingly, the scribe lines LN1 and LN2 can be thinned very simply in terms of process.

In the case where the present invention is applied, even when a semiconductor substrate is thick, a non-contact cutting manner can be used. Therefore, application of the present invention can be particularly useful in the forming of MEMS chips by using the whole semiconductor substrate, so-called manufacturing of bulk micro machine.

As used herein, the following directional terms "forward, rearward, above, downward, vertical, horizontal, below, and transverse" as well as any other similar directional terms refer to those directions of a device equipped with the present invention. Accordingly, these terms, as utilized to describe the present invention should be interpreted relative to a device equipped with the present invention.

Second Embodiment

A second embodiment will now be explained. In view of the similarity between the first and second embodiments, the parts of the second embodiment that are identical to the parts of the first embodiment will be given the same reference numerals as the parts of the first embodiment. Moreover, the descriptions of the parts of the second embodiment that are identical to the parts of the first embodiment may be omitted for the sake of brevity.

In a second embodiment, although the scribe lines are thinned in a manner similar to the first embodiment, the scribe lines are additionally cut in a part of manufacturing processes of MEMS chips (acceleration sensing device).

Structure

The structure of the second embodiment is similar or identical to the acceleration sensing device 1 of the first embodiment shown in FIGS. 1(a) to (c).

Method for Manufacturing Device and Forming Individual Devices

Forming Electric Element

Similar to the first embodiment, the electric elements are formed on the first Si film 101 of the SOI substrate by the processes shown in FIG. 2.

Forming Mechanical Element and Forming Individual Devices

The grooves 8 and 110 are formed, and the buried oxide film 103 is exposed through the processes shown in FIGS. 3 and 4 similar or identical to those of the first embodiment.

Subsequently, as shown in line (j) of FIG. 5, double-sided adhesive type dicing tape 113 is stuck on the surface of a support substrate 112, such as a semiconductor substrate or quartz substrate that has been separately prepared. In this embodiment, the wafer shown line (g) of FIG. 4 and formed by the processes shown in FIGS. 2 and 3 and line (g) of FIG. 4 is completed and is adhered to the dicing tape 113. The wafer is fixed on the support substrate 112 with the dicing tape 113 in this process. The reason is to avoid scattering the individual acceleration sensing devices 1 when the scribe lines (L1, L2) are cut in the later process.

Subsequently, as shown in line (k) of FIG. 5, the silicon nitride layer 108 located in the regions corresponding to the grooves 2 is removed by photolithographic etching. After the resist is removed, the first Si film 101 located in the region corresponding to the groove 2, and the regions corresponding to the scribe lines (L1, L2) are removed by photolithographic etching, again. Subsequently, the buried oxide film 103, which is exposed in the regions corresponding to the grooves 2 and the scribe lines (L1, L2), is removed by dry etching. The weight intermediate film 11 is formed between the mass portion 3 and the weight portion 9, and the peripheral intermediate film 12 is formed between the support portion 4 and the mount portion 10. The scribe line is cut in this dry etching process, and the individual acceleration sensing devices 1 are formed.

Finally, the adhesive force of the dicing tape 113 is weakened by UV (Ultra Violet) irradiation, heat treatment, and so on. Thus, the individual acceleration sensing devices 1 are picked up.

Operation/Working-Effect

Figure 5:
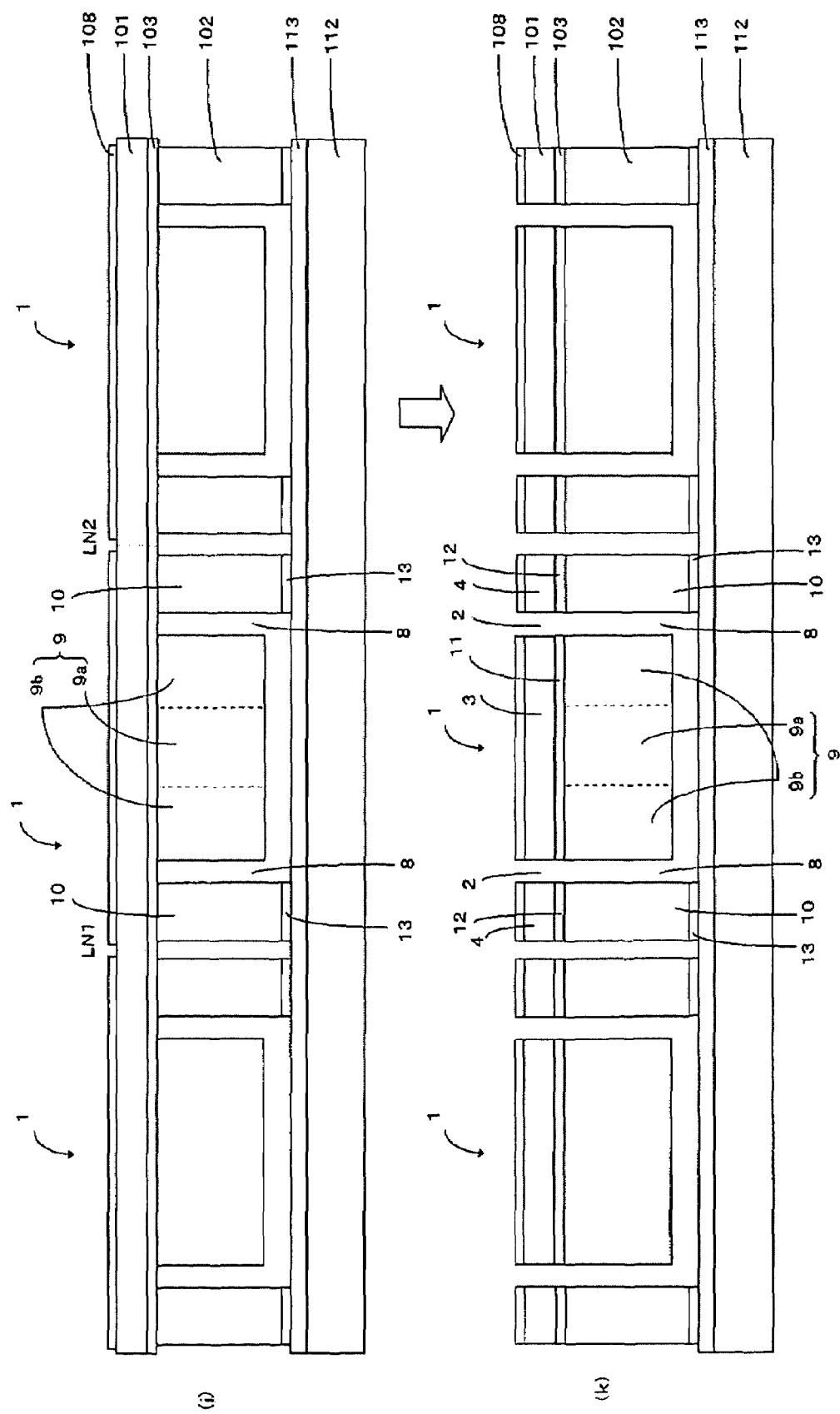
FIG. 5 is a view of diagrams illustrating processes in the method for manufacturing the acceleration sensing device according to the second embodiment.

In the method for forming individual semiconductor devices according to the second embodiment, the individual MEMS chips (acceleration sensing devices) are simultaneously formed with a part of the manufacturing processes of the MEMS chips, for example, the process of removing the buried oxide film 103 by dry etching in this embodiment (see line (k) of FIG. 5). Accordingly, the individual MEMS chips (acceleration sensing devices) can be formed very simply in terms of process. Since cutting is performed by dry etching in a non-contact manner, it is possible to suppress damage to the mechanical element of the MEMS chips due to an external force in cutting.

In the case where the present invention is applied, even when a semiconductor substrate is thick, a non-contact cutting manner can be used. Therefore, application of the present invention can be a useful way, particularly to, in forming of MEMS by using the whole semiconductor substrate, so-called manufacturing of bulk micro machine.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

This application claims priority to Japanese Patent Application No. 2004-244609. The entire disclosure of Japanese Patent Application No. 2004-244609 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A method for forming individual semiconductor devices comprising:
    preparing a semiconductor substrate having,
        a first face having,
            a first region and
            a second region surrounding said first region with a scribe line being formed therein, and
        a second face having,
            a third region being opposed to said first face and corresponding to said first region, and
            a fourth region surrounding said third region and corresponding to said second region;
    forming a first groove and a third groove of a prescribed death in the semiconductor substrate simultaneously, wherein the first groove is formed in said fourth region opposing said scribe line and the first groove has a bottom portion, and the third groove is formed in said third region;
    forming a second groove in the semiconductor substrate in said first region, the second groove having a bottom portion that is the semiconductor substrate;
    removing the bottom portion of the semiconductor substrate of the second groove within the second groove, so that the second groove passes through to said third region of the semiconductor substrate; and
    cutting the semiconductor substrate along the scribe line, so that the scribe line passes through to the bottom portion of the first groove having the prescribed depth, after said removing the bottom portion of the second groove,
    wherein said forming the second groove is performed after said forming the first groove.

2. The method for forming individual semiconductor devices according to claim 1, wherein cutting said semiconductor substrate is performed in a non-contact cutting manner by using a non-solid cutting medium.

3. The method for forming individual semiconductor devices according to claim 2, wherein a laser is used during said cutting the semiconductor substrate.

4. The method for forming individual semiconductor devices according to claim 2, wherein said cutting semiconductor substrate is performed in a non-contact cutting manner by dry etching.

5. The method for forming individual semiconductor devices according to claim 4, wherein said semiconductor substrate is fixed on a support substrate with dicing tape when cutting said semiconductor substrate 6. The method for forming individual semiconductor devices according to claim 1, wherein said semiconductor substrate is an SOI substrate.

7. The method for forming individual semiconductor devices according to claim 1, wherein the individual semiconductor devices are micro-mechanical elements having a weight portion, a mount portion surrounding a periphery of the weight portion, and a beam portion connecting the weight portion and the mount portion.

8. The method for forming individual semiconductor devices according to claim 1, wherein said removing the bottom portion is performed by a dry etching process.

9. A method for manufacturing MEMS chips comprising:
a first step of preparing a multi-layer substrate including a first layer as a top layer, a second layer, and a third layer in order, the multi-layer substrate including,
a first face having a first region having MEMSs being formed therein, and a second region surrounding said first region having a scribe line being formed therein, and
a second face having a third region being opposed to said first face and corresponding to said first region, and a fourth region surrounding said third region and corresponding to said second region,
a second step of partially removing said third layer to form a weight portion and a mount portion surrounding a periphery of said weight portion in said first and third regions in said third layer;
a third step of thinning said third layer in said fourth region corresponding to said scribe line formed in said second region of said first layer simultaneously with said second step;
a fourth step of partially removing said first layer to form a mass portion securing said weight portion to said first and third regions of said first layer, a support portion surrounding a periphery of said mass portion and supporting said mount portion, and a beam portion connecting said mass portion to said support portion;
a fifth step of forming a through hole by removing said second layer exposed from said first and third layers in said first and third regions; and
a sixth step of forming individual pieces of the multi-layer substrate along said scribe line formed in said second region of said first layer.

10. The method for manufacturing MEMS chips according to claim 9, wherein said sixth step is performed in a non-contact cutting manner using a non-solid cutting medium.

11. The method for manufacturing MEMS chips according to claim 10, wherein a laser is used in said non-contact cutting manner.

12. The method for manufacturing MEMS chips according to claim 9, wherein said fourth step further includes a step of removing said first layer in said second and fourth regions, and
said fifth step further includes removing said second layer exposed from said first and third layers in said second and fourth regions to form said individual pieces, wherein said sixth step is performed simultaneously with said fifth step.

13. The method for manufacturing MEMS chips according to claim 12, wherein dry etching is used in said first step.

14. The method for manufacturing MEMS chips according to claim 13, wherein said multi-layer substrate is fixed on a support substrate with dicing tape in said fifth step.

15. A method for manufacturing MEMS chips comprising:
preparing a multi-layer substrate including a first layer as a top layer, a second layer, and a third layer in order, the multi-layer substrate including
a first face having a first region, and a second region surrounding the first region having a scribe line therein, and
a second face having a third region opposed to the first face and corresponding to the first region, and a fourth region surrounding the third region and corresponding to the second region;
partially removing the third layer to form a part of MEMS structures in the first and third regions;
thinning the third layer to the second layer in the fourth region corresponding to the scribe line formed in the second region of the first layer simultaneously with said partially removing the third layer;
partially removing the first layer to complete formation of the MEMS structures in the first and third regions;
forming a through hole by removing the second layer exposed from the first and third layers in the first and third regions; and
forming individual pieces of the multi-layer substrate along the scribe line consisting of the second region of said first layer and said second layer.

16. The method for manufacturing MEMS chips according to claim 15, wherein said forming individual pieces is performed in a non-contact cutting manner.

17. The method for manufacturing MEMS chips according to claim 15, wherein a laser is used during said forming individual pieces.

* * * * *